United States Patent [19]

Pham Ngu et al.

[11] Patent Number: 4,725,566

[45] Date of Patent: Feb. 16, 1988

[54] METHOD OF FORMING AT LEAST TWO METALLIZATIONS OF A SEMICONDUCTOR COMPONENT, COVERED WITH A DIELECTRIC LAYER

[75] Inventors: Tung Pham Ngu, Paris; Jean Chevrier, Gif sur Yvette, both of France

[73] Assignee: Thomson-CSF, Paris, France

[21] Appl. No.: 871,869

[22] Filed: Jun. 9, 1986

[30] Foreign Application Priority Data

Jun. 11, 1985 [FR] France ............................... 85 08808

[51] Int. Cl.⁴ .............................................. B05D 5/12
[52] U.S. Cl. .................................. 437/180; 437/245; 427/259
[58] Field of Search .................. 427/89, 91, 82, 259; 357/71; 437/180, 245

[56] References Cited

U.S. PATENT DOCUMENTS

| | | | |
|---|---|---|---|
| 4,108,717 | 8/1978 | Widmann | 427/259 |
| 4,109,029 | 8/1978 | Ozdemir | 427/89 |
| 4,353,935 | 10/1982 | Symersky | 427/89 |
| 4,617,193 | 10/1986 | Wu | 357/71 |

FOREIGN PATENT DOCUMENTS 2118777A 11/1983 United Kingdom ................ 357/71

Primary Examiner—Norman Morgenstern
Assistant Examiner—Vi Duong Dang
Attorney, Agent, or Firm—Oblon, Fisher, Spivak, McClelland & Maier

[57] ABSTRACT

A method is provided for forming metallizations on a semiconductor component, which are closer together than is possible with the present day masking technology.

In accordance with the invention, a pattern of minimum dimensions is defined in a mask by means of two openings. This pattern is underetched, either by light overexposure, or by particle back-scattering. Two metallizations are deposited, directionally in the bottom of the openings then a dielectric layer is deposited, non directionally, on the metallizations, the mask is removed by dissolution.

7 Claims, 8 Drawing Figures

FIG_1 PRIOR ART
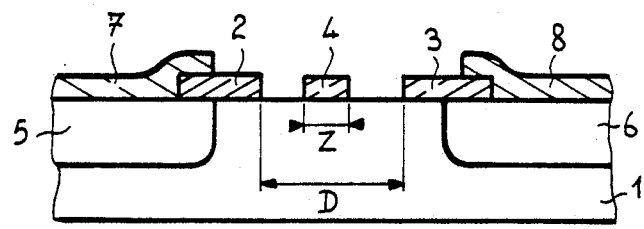
FIG_2
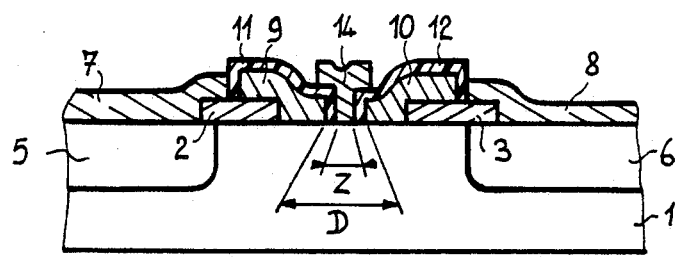
FIG_8
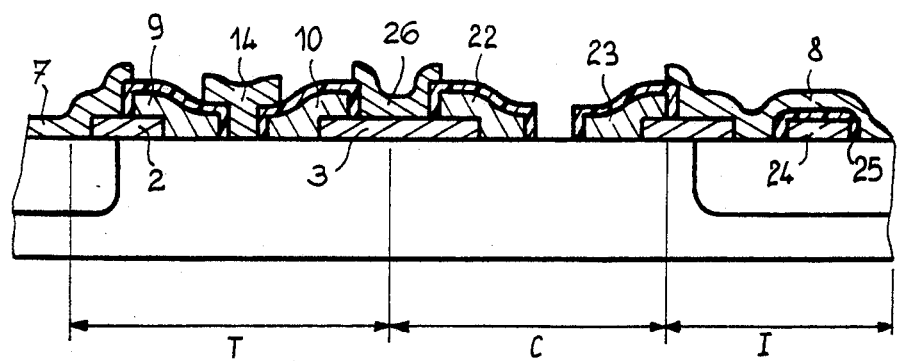

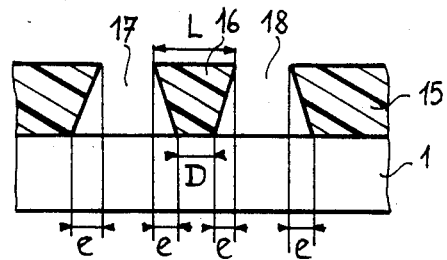
FIG_3
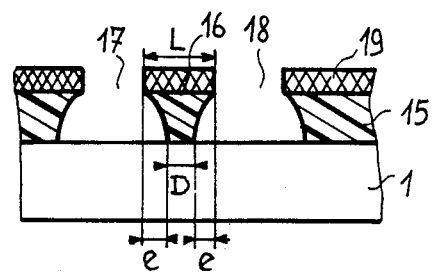
FIG_4
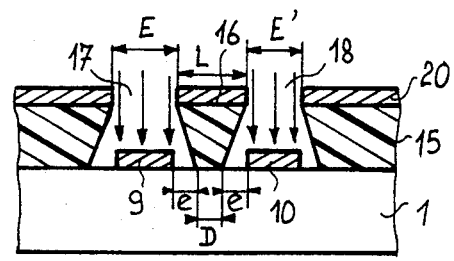
FIG_5
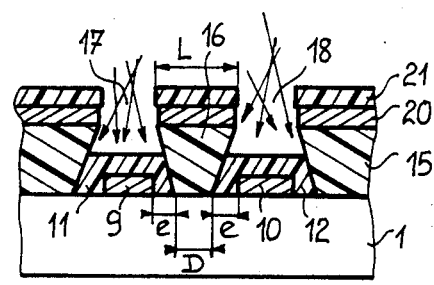
FIG_6
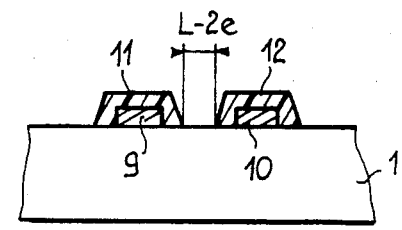
FIG_7

METHOD OF FORMING AT LEAST TWO METALLIZATIONS OF A SEMICONDUCTOR COMPONENT, COVERED WITH A DIELECTRIC LAYER

BACKGROUND OF THE INVENTION

1. Field of the Invention

The present invention relates to a method of obtaining self insulated metallizations on a semiconductor component, such as a transistor or an integrated circuit, this method allowing two metallizations to be obtained separated by a distance, measured on the surface of the semiconductor wafer, less than the definition of the masks, that is to say less than the smallest dimension of the masks. The method of the invention applies to the formation of transistors, integrated circuits, loads for transistors, as well as to the crossing of conducting tracks: in fact, the metallizations obtained by this method are self insulated, that is to say covered with an insulating layer. The invention also relates to the semiconductor components produced by this method.

2. Description of the Prior Art

The development of high speed electronics, that is to say that which is formed for example on a III-V material such as GaAs or other comparable materials comes up against two types of difficulties.

The first difficulty is related to the limitation of the definition of the mask. Although optical masking, that is to say obtained by a photon beam, is in many cases superseded by electronic or X ray masking by which lines separated by less than a micron can be formed, it would be desirable to further improve this definition, which would allow higher speed transistors to be obtained, the source/drain distance in the field effect transistors being reduced, and so the transit time of the charge carriers reduced. Such an improvement would be advantageous to the extent that it allows an industrial application resulting in normal manufacturing yields for this type of activity, and to the extent that the breakdown voltages between two metallizations under operating voltage are avoided.

The second difficulty is specific to transistors. In ultra high speed integrated logic circuits, it is very important to reduce the parasite access resistances of the field effect transistors, namely the resistances between source and gate and between gate and drain. Numerous solutions have been proposed. The most usual are: transistors with hollowed out channel and transistors obtained by self aligned implantation. These solutions have given very good results but with very mediocre manufacturing yields because of the difficulties of controlling the threshold voltages in the hollowing out of the channel or in the annealing of the implantations.

On the other hand, the so called planar technology, that is to say that in which the surface of a semiconductor component is flat, has the very great advantage of controlling this threshold voltage well.

With the simplicity of the planar method, the manufacturing yield may be very high. But the weak point of this technology is having parasite access resistances a little higher than in the other methods described.

The invention provides then a new self insulating method which reduces these parasite resistances without losing the advantage of having well controlled threshold voltages. In other words, the invention provides a method for forming at least two metallizations, which are self insulated, and wherein the distance separating them is smaller than that obtained by the methods known up to now.

SUMMARY OF THE INVENTION

The method of the invention allows at least two self insulated metallizations to be formed, in which the distance separating them is smaller than the smallest dimension of a pattern of masking by particles, electrons or X rays. For this, the method uses under-etching of the resin layer which forms the mask, so that a resin pattern having, on its free surface, a dimension equal to the minimum dimension permitted by the technology used, has on its surface in contact with the substrate a lesser dimension, because the resin layer is underetched. The underetching is obtained either by backscattering of particles which bounce on the crystalline network of the substrate, with lateral diffusion in the resin, or by chemical underetching, after hardening the free surface of the resin layer by means of appropriate products such as cholorobenzene for example. The two metallizations are then deposited on each side of the masking pattern, using a directional method, which does not reach the under-etched space in the mask, then they are covered with a layer of an insulating material by a non directional method, so that the insulating material fills the under-etched space.

The masking pattern is then eliminated by dissolution, using the so called "lift off" technique: the two self insulated metallizations are separated by a distance equal to the base of the masking pattern, that is to say a distance equal to the minimum dimension of a pattern reduced by twice the under-etching of said pattern. If the masking technology allows patterns of a micron to be formed, for example, they can be under-etched by 0.25 micron, which means that two self insulated metallizations may be obtained separated by 0.5 micron: since they are covered with an insulating layer, it is sufficient to fill the gap between the two metallizations with a metal so as to form for example the gate of a field effect transistor whose length is 0.5 micron, between two source and drain metallizations separated by a micron.

More precisely, the invention relates to a method of forming at least two metallizations of a semiconductor component, covered with a dielectric layer and separated, on the surface of the wafer of the semiconductor component, by a distance less than the manufacturing mask definition of said component, this method being characterized in that the distance which separates the two dielectric coated metallizations is defined by underetching a resin pattern of the mask, said pattern being situated between the two dielectric coated metallizations, and having on its free face a width equal to the definition of the mask, and on its face in contact with the wafer of the component a width equal to the definition of the mask reduced by twice the under-etching of the pattern.

BRIEF DESCRIPTION OF THE DRAWINGS

The invention will be better understood from the following detailed description of some embodiments, this description referring to the accompanying Figures which show:

FIG. 1, a sectional view of a transistor of the prior art, defining the critical dimensions of or between the metallizations, FIG. 2, a sectional view of a transistor obtained by the method of the invention, FIGS. 3 to 7, different steps in the method of forming two self insulated metallizations in accordance with the invention, and FIG. 8, a sectional view of the circuit showing three examples of application of the method of the invention.

DESCRIPTION OF THE PREFERRED EMBODIMENTS

Although the method applies generally to the formation of metallizations two at least of which are separated from each other by a dimension less than the minimum dimensions of the forming mask, the invention will be described with reference to the case of the formation of a field effect transistor, so as to be more precise in its description. However, it goes without saying that this case concerns only one example of application of the method, which is moreover illustrated by the formation of components other than a field effect transistor, without for all that limiting the scope of the invention.

The prior comparison between a field effect transistor obtained by the prior art method and the field effect transistor obtained by the method of the invention will better show the meaning and advantage of the method which will be described hereafter.

FIG. 1 shows very schematically a sectional view of a transistor of the prior art. Such a transistor is formed on a substrate 1, one face of which carries access metallizations 2 and 3, for example the source and the drain, and a control metallization 4 which is the gate. Caissons implanted, for example with boron, in substrate 1 define the active layer of the transistor, which is situated between caissons 5 and 6, and under the region covered by the metallizations 2, 3 and 4. Metallizations 7 and 8, making ohmic contact with the access or control metallizations connect this transistor to the rest of the electronic circuit.

So as to be able to operate at very high frequencies, corresponding to ultra high speed electronics such as that which is at present developed on materials of the family III–V, it must be possible on the one hand to form a gate of very small length Z and, on the other, to deposit source 2 and drain 3 metallizations with a spacing or a distance D which separates them as small as possible. In fact, these dimensions Z for the gate and D for the source and drain control the transit time of the electrons through the active layer and the smaller these dimensions the lower the transit time, and the higher the operating frequency of the transistor. Furthermore, the access resistances between source 2 and gate 4 and between drain 3 and gate 4, corresponding to the distances travelled by the electrons in the active layer of the transistor are all the smaller the closer the source 2 and drain 3 electrodes are to gate 4. But, on the other hand, the proximity between the metallizations is limited by the risk of breakdown when the transistor is in operation and when voltage differences exist between these different metallizations. By way of example, in present day transistors the gate length Z is of the order of or greater than 0.7 micron, and the distance D between source and drain is conventionally of the order of 3 microns, which amounts to about 1.1 microns between the source and gate metallizations 2 and 4 and 1.1 microns between the drain and gate metallizations 3 and 4.

FIG. 2 shows a sectional view of a transistor whose metallizations have been obtained by the method of the invention. It comprises a substrate 1, in which caissons 5 and 6 have been implanted and on which electric conductors 7 and 8 are in ohmic contact with primary source and drain metallizations 2 and 3. These metallizations are called primary for they are necessary in order to provide the ohmic contact between the true source and drain metallizations 9 and 10 and the external interconnections 7 and 8.

From this transistor semiformed using conventional techniques, the source 9 and drain 10 metallizations are deposited using the method of the invention which will be described subsequently: the original point is that these two metallizations 9 and 10 are separated from each other by a dimension D less than the conventional masking limit, using a current technology, and that in addition each of these two metallizations is covered with an insulating layer, 11 on metallization 9 and 12 on metallization 10. The distance Z which separates the insulating layers covering the metallizations 9 and 10 allows a gate metallization 14 to be formed in this gap. By way of comparison, with the prior art transistor described in FIG. 1, for a transistor formed in accordance with the method of the invention, the length Z of gate 14 is equal to 0.5 micron and the distance D which separates the source and drain metallizations 9 and 10 is equal to 1 micron.

The fact that the source and drain metallizations 9 and 10 are formed in self insulated fashion, that is to say that the insulating layer 11 and 12 which covers them is formed during the same manufacturing operation, with the same mask, allows said source and drain metallizations to be brought closer together than was possible with the conventional technology for there would then be breakdown because of too short a length between the metallizations, when they are live. Similarly, this insulating layer 11 and 12 allows a gate to be formed which bears directly on the source and drain metallizations, without for all that being short circuited with them since it is separated therefrom by an insulating layer.

Of course the very nature of the field effect transistor, that is to say its depletion or enrichment operation, and its structure under the metallizations, has no connection with the invention. This structure may be with heterojunctions or homojunctions; the important thing is to form a very fine gate disposed between two source and drain electrodes which are very close together.

FIGS. 3 to 7 show the different steps in forming the two self insulated metallizations in accordance with the invention.

In FIG. 3, a resin masking layer 15 is deposited on a substrate 1, which is for example the ring in which transistors or integrated circuits are manufactured. In the resin masking layer 15 at least one pattern 16 is defined, by means of two openings 17 and 18. The pattern 16 may be defined by optical masking, that is to say using photons for determining a pattern in the mask, but of course electronic or X ray masking is preferable since it is desired to form patterns whose dimensions are smaller than the dimensions obtained with present day masking technologies. Pattern 16 has then on its free surface, that is to say the external surface, a minimum dimension L which is for example 1 micron. For this pattern 16 a base may be obtained, that is to say its surface in contact with substrate 1, whose dimensions "D" are smaller than the dimensions L of the free surface. For that the resin mask 15 is developed either with light over-exposure, or with electronic over-dosing so that the resin is etched in its lower part situated on the side of substrate 1, and thus under-etched. In the case of the development using an electronic beam, it is known that the electrons bounce on the crystalline network of the semiconductor material forming substrate 1, and that this bouncing gives rise to back scattering which under-etches pattern 16 over a width "e" on each side of a pattern, so that the base of pattern 16 has a width "D" equal to the width L of its free part, reduced by twice the under-etching "e".

FIG. 4 shows a variant of forming pattern 16, this variant being obtained by optical masking. In this case, a mask 15 may be obtained by hardening the layer 19 on its free surface by means of an appropriate product such for example as chlorobenzene. With surface 19 thus hardened, when the resin is dissolved by a chemical solvent, the action of the solvent has a lateral effect greater on the side of the substrate than on the side of the free surface 19 since this latter has been hardened; the result is then also under-etching of pattern 16 which results in a narrowing of its base equal to twice the under etching "e".

The following operation is shown in FIG. 5. It consists in forming a metal deposit by evaporation of a suitable metal with an electron gun, whose ion flow is directional. In an electron gun, the metal to be deposited is heated in a pin point by an electron beam: the beam or metal ions emitted by the metal thus heated has a very small section and parallel to itself. The directional deposition is shown in FIG. 5 by parallel arrows, which penetrate through openings 17 and 18 so as to deposit in the bottom of said openings on each side of pattern 16 the two metallizations 9 and 10. These metallizations have therefore dimensions which correspond to the dimensions E and E' of openings 17 and 18. Consequently, since the resin masking layer 15 has been under-etched, metallizations 9 and 10 do not come into contact with the walls of the resin layer 15 in the under-etched region. Simultaneously, a metal layer 20 is deposited on the free surface of mask 15.

The fact that metallizations 9 and 10 do not come into contact with the under-etched walls of the resin mask 15 is used in the next operation shown in FIG. 6. An insulating material such as silica $SiO_2$, silicon nitride $Si_3N_3$, or even an insulating polymer is deposited in the bottom of openings 17 and 18 by non directional spraying. Such non directional spraying, also called sputtering, is shown symbolically by arrows which are not parallel to each other. The insulating material deposit consequently fills, at least up to a certain height, the openings 17 and 18 which define pattern 16. Thus, the insulating material completely covers metallizations 9 and 10, thus providing the two layers 11 and 12 shown in FIG. 2. Of course, an insulating layer 21 is also deposited on the surface of the resin mask 15.

It will be noted that, since metal 9 and 10 was deposited in the preceding step in accordance with the contour of openings 17 and 18, that is to say with a spacing "e" with respect to the under-etched base of the pattern 16 of the resin mask 15, it follows then in FIG. 6 that these same metallizations 9 and 10 are insulated, in a horizontal plane by a thickness "e" of the insulating material, silica or silicon nitride.

FIG. 7 shows the last step in the method for forming two self insulated metallizations: by a lift-off operation, the resin mask 15 is removed, as well as the metal 20 and insulating material 21 deposits on the free surface. Only the metallizations 9 and 10 therefore remain covered by an insulating layer 11 and 12 which have not been dissolved by the solvent of the masking resin. These metallizations 9 and 10, self insulated by layers 11 and 12, are therefore spaced apart by a dimension equal to $L-2e$, this dimension being smaller than the definition of mask 15 since it is equal to L, the assumption taken at the outset, since a pattern whose dimensions are less than L cannot be formed with a given masking technology.

FIGS. 3 to 7 have described the method of forming two metallizations 9 and 10 deposited directly on substrate 1. Of course, if it is a question of forming a transistor such as the one shown in FIG. 2, in which the source and drain metallizations 2 and 3 are brought close together by the formation of new source and drain metallizations 9 and 10, the method described in FIGS. 3 to 7 must form a part of metallizations 9 and 10, that is to say also the masking patterns, partially on the pre-existing metallizations 2 and 3. These latter are in fact necessary since the metallizations formed with the method of the invention are automatically coated with an insulating material: consequently, if there was previously no ohmic metal deposition 2 and 3, it will not be possible to provide the electric continuity between the source and drain metallizations 9 and 10 and the external access metallizations 7 and 8.

FIG. 8 shows a sectional view of a circuit in which three examples of application of the process of the invention are integrated. This circuit, a symbolic circuit, comprises a tansistor in the region referenced T, an active load in the region referenced C and an interconnection crossing in the region referenced I.

The transistor in the region referenced T is the one shown in FIG. 2 and it comprises two source and drain electrodes 9 and 10 and a gate electrode 14. The active load, in the region referenced C, is a gateless transistor. It is known that in logic circuits, particularly high speed circuits, the resistances are often replaced by transistors whose gate has been omitted. Consequently, the load of a transistor such as the one shown at the left in the Figure may be very readily formed, during the same operations and using the same manufacturing technology, by an active load formed solely by two self insulated metallizations 22 and 23. The current flows through the thickness of the active layer of the circuit between the two electrodes 22 and 23 with an intensity which depends exclusively on the voltage delivered by the transistor. Finally, since the method of the invention provides metallizations which are self insulated, this method may be used for providing crossings between two conductors, without short circuiting since the conductors such as the one shown by metallizations 24 is insulated from conductor 8 by the insulating layer 25 which covers it.

It can be seen that, in order to form an integrated circuit comprising simultaneously at least one transistor, an active load and crossing over of two conductors, the operations may be conducted simultaneously. It will be sufficient, during the last metallization which will provide the gate 14 of the transistor and the interconnection metallizations 7, 8 and 26, to suitably mask the parts which are not to be metallized, such for example as the position of the gate, omitted, in the active load, as well as the spaces covering the metallizations 9, 10, 22 and 23 so that the last metal deposit does not short circuit the active metallizations in this circuit.

The following table gives the dimensions of the mask and of the self insulated metal deposits which may be obtained with the method of the invention. These dimensions are given in microns, and the column referenced T relates to the formation of a transistor whereas the column referenced I relates to the formation of crossovers between conductors such as conductors 24 and 8.

|  | T | I |
| --- | --- | --- |
| Thickness of the resin mask | 15 | 1 | 1 |
| Openings | E | 2 | 2 |
| Distance between two openings | L | 1 | 2 |
| Width at the base of an opening |  | 2.5 | 2.5 |
| Width at the base of a pattern | D | 0.5 | 1.5 |
| Metal thickness | 20 | 0.15 | 0.15 |
| Dielectric thickness | 21 | 0.2 | 0.2 |

Although the process of the invention relates essentially to the formation of two metallizations on a substrate, these two metallizations being closer together than is possible with present day masking technology, this method is especially advantageous for forming self insulated transistors. It is a question of a planar technique since, during different operations, there is no hollowing out in the wafer of starting semiconductor materials. This planar technique and this method of forming self insulated metallizations provide a number of advantages relative to the operation of the transistor. They are:

- a low voltage loss because of the closely spaced source and drain contacts,
- low access resistances since the distance between the source and drain electrodes and the gate electrode is only equal to the thickness of the dielectric deposited on the two source and drain metallizations,
- a better transconductance,
- a better breakdown resistance because of the presence of dielectrics inserted between the three source, gate and drain metallizations,
- an excellent tolerance in alignment of the gate with respect to the source and drain contacts, since the source and drain metallizations are used as mask for manufacturing the self aligned gate metallization,
- possibility of forming gates 0.5 micron in length.

Because of the breakdown risk, it is pointless in conventional transistors to form gates with a length of 0.5 micron, for the parasite resistance related to the distance between gate and source or drain electrode attenuates the effect of reduction of the gate length: that becomes possible with the method of the invention, and the presence of the insulating layer eliminates the risk of breakdown.

The method of forming self insulated metallizations is essentially used for producing discrete or integrated components in ultra high speed electronics, more particularly for logic circuits on GaAs or III-V materials, intended for telecommunications, radar, short wave links.

What is claimed is:

1. A process for forming at least two metallizations of a semiconductor component, covered with a dielectric layer and separated, on the surface of the wafer of the semiconductor component, by a distance less than the definition of the mask for manufacturing said component, comprising the following steps:
   (a) deposition on a substrate of a masking resin, comprising at least pattern, included between two openings, the dimension L between said two openings being equal to the smallest possible dimension of the mask,
   (b) under etching along a distance e of the resin, giving to said pattern a dimension D at the base less than said dimension L on its free surface, between said two openings,
   (c) deposition of at least two metallizations, on said substrate, using a directional method, said metallizations having the same dimensions as those of said openings,
   (d) deposition on said metallizations of a layer of an insulating dielectric material using a non directional method, said dielectric layer filling the under-etched space between said resin pattern and said metallizations,
   (e) removal of the resin mask and of the pattern by dissolution, leaving on the substrate said two self insulated metallizations separated by a distance equal to said dimension D wherein $D=L-2e$ less than the definition of the mask.

2. The method as claimed in claim 1, wherein, if electronic masking is used, under-etching of the resin of the mask if obtained by over-dosing the electrons.

3. The method as claimed in claim 1, wherein, if optical masking is used, under-etching of the resin of the mask is obtained by light over-exposure, with hardening of the surface layer of the mask by means of chloro benzene.

4. The method as claimed in claim 1, wherein the metals which form said metallizations are deposited by directional evaporation.

5. The method as claimed in claim 1, wherein the dielectric materials deposited on said metallizations are deposited by plasma spraying.

6. The method as claimed in claim 1, wherein the dielectric material deposited on said metallization is oxide or silicon nitride.

7. The method as claimed in claim 1, wherein the dielectric material deposited on said metallizations is a polymerizable resin, insoluble in the solvent removing the mask.

* * * * *